United States Patent
Ko et al.

(10) Patent No.: US 8,860,544 B2
(45) Date of Patent: Oct. 14, 2014

(54) INTEGRATED INDUCTOR

(75) Inventors: Ching-Chung Ko, Hsinchu County (TW); Tung-Hsing Lee, Taipei County (TW); Kuei-Ti Chan, Hsinchu (TW); Tao Cheng, Hsinchu (TW); Ming-Tzong Yang, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 94 days.

(21) Appl. No.: 12/493,245

(22) Filed: Jun. 29, 2009

(65) Prior Publication Data

US 2009/0261937 A1    Oct. 22, 2009

Related U.S. Application Data

(63) Continuation-in-part of application No. 11/768,199, filed on Jun. 26, 2007, now abandoned.

(60) Provisional application No. 61/180,164, filed on May 21, 2009.

(51) Int. Cl.
   *H01F 5/00* (2006.01)

(52) U.S. Cl.
   USPC .......................................... 336/200

(58) Field of Classification Search
   USPC ................... 336/200, 232; 257/531
   See application file for complete search history.

(56) References Cited

U.S. PATENT DOCUMENTS

| | | | |
|---|---|---|---|
| 5,446,311 A | 8/1995 | Ewen et al. | |
| 6,057,202 A * | 5/2000 | Chen et al. | 438/381 |
| 6,180,445 B1 | 1/2001 | Tsai | |
| 6,258,688 B1 | 7/2001 | Tsai | |
| 6,437,409 B2 * | 8/2002 | Fujii | 257/379 |
| 6,437,427 B1 | 8/2002 | Choi | |
| 6,455,885 B1 | 9/2002 | Lin | |
| 6,486,017 B1 | 11/2002 | Verma | |
| 6,611,188 B2 * | 8/2003 | Yeo et al. | 336/192 |
| 6,630,373 B2 | 10/2003 | Punzalan et al. | |
| 6,636,139 B2 | 10/2003 | Tsai et al. | |
| 6,876,069 B2 | 4/2005 | Punzalan et al. | |
| 6,903,644 B2 | 6/2005 | Wang | |
| 7,135,951 B1 | 11/2006 | Sidhu | |
| 7,141,883 B2 | 11/2006 | Wei et al. | |
| 7,230,323 B2 | 6/2007 | Lee et al. | |
| 7,242,077 B2 | 7/2007 | Ma et al. | |
| 7,268,409 B2 | 9/2007 | Tseng | |
| 7,663,205 B2 | 2/2010 | Chung | |
| 2001/0028098 A1 | 10/2001 | Liou | |

(Continued)

FOREIGN PATENT DOCUMENTS

CN        1979800 A        6/2007

*Primary Examiner* — Tuyen Nguyen

(74) *Attorney, Agent, or Firm* — Winston Hsu; Scott Margo

(57) ABSTRACT

An integrated inductor includes a winding consisting of an aluminum layer atop a passivation layer, wherein the aluminum layer does not extend into the passivation layer and has a thickness that is not less than about 2.0 micrometers. The passivation layer has a thickness not less than about 0.8 micrometers. By eliminating copper from the integrated inductor and increasing the thickness of the passivation layer, the distance between the bottom surface of the inductor structure and the main surface of the semiconductor substrate is increased, thus the parasitic substrate coupling may be reduced and the Q-factor may be improved. Besides, the increased thickness of the aluminum layer may help improve the Q-factor as well.

8 Claims, 3 Drawing Sheets

(56) References Cited

U.S. PATENT DOCUMENTS

| | | |
|---|---|---|
| 2001/0041401 A1 | 11/2001 | Ahn |
| 2001/0045616 A1 | 11/2001 | Yoshitomi |
| 2002/0008301 A1 | 1/2002 | Liou |
| 2002/0190349 A1 | 12/2002 | Maeda |
| 2003/0077845 A1* | 4/2003 | Ohkubo et al. .................. 438/3 |
| 2003/0102521 A1 | 6/2003 | Maeda |
| 2004/0004255 A1 | 1/2004 | Yoshimura |
| 2005/0012153 A1 | 1/2005 | Ipposhi |
| 2005/0124131 A1 | 6/2005 | Hweing |
| 2006/0022787 A1 | 2/2006 | Brennan |
| 2006/0030115 A1 | 2/2006 | Chung |
| 2006/0125589 A1 | 6/2006 | Tamata |
| 2006/0250198 A1* | 11/2006 | Meltzer et al. ................ 333/185 |
| 2007/0138557 A1 | 6/2007 | Ipposhi |
| 2007/0279176 A1 | 12/2007 | Chen et al. |
| 2008/0054460 A1 | 3/2008 | Hung |
| 2008/0122028 A1 | 5/2008 | Hsu |
| 2008/0290480 A1 | 11/2008 | Gogoi |
| 2009/0057824 A1 | 3/2009 | Kwak |
| 2009/0152674 A1 | 6/2009 | Uchida |
| 2010/0295150 A1 | 11/2010 | Chan |

\* cited by examiner

INTEGRATED INDUCTOR

CROSS REFERENCE TO RELATED APPLICATIONS

This application is a continuation-in-part of U.S. application Ser. No. 11/768,199 filed Jun. 26, 2007. This application also claims the benefit of U.S. provisional application No. 61/180,164 filed May 21, 2009.

BACKGROUND OF THE INVENTION

1. Field of the Invention

The invention relates generally to the field of semiconductor integrated circuit design, and more particularly, to an on-chip high-Q (high quality factor) integrated inductor structure.

2. Description of the Prior Art

The fast growing of the wireless market has created an urgent demand for smaller and cheaper handsets with increased functionality and performance. A major trend of circuit design is to incorporate as many circuit components into integrated circuit form as possible, whereby cost per wafer can be reduced.

Inductors built in semiconductor wafers are widely used in CMOS based radio frequency (RF) circuits such as low-noise amplifiers, voltage-controlled oscillators and power amplifiers. An inductor is a passive electronic component that stores energy in the form of a magnetic field, and an inductor tends to resist any change in the amount of current flowing through it.

One of the most important characteristics of the inductor is the quality factor Q, which relates to the performance of the RF or other circuits and systems. The quality factor Q of an integrated circuit is limited by parasitic losses within the substrate itself. These losses include high resistance through metal layers of the inductor itself. Consequently, in order to achieve a high quality factor, resistance within the inductor should be held to a minimum. One approach to minimizing the resistance of the inductor is increasing the thickness of metal used to fabricate the inductor.

Therefore, integrated inductors fabricated by RF baseline process may have decreased resistance due to much thicker top metal layer (i.e., the topmost level of the damascene copper interconnection). It is easier for one of the skilled in the art to implement a much thicker top metal layer than other metal layers. Taking 0.13 µm RF baseline process as an example, a top metal layer with a thickness of as high as 3 µm is a commonplace. However, such ultra thick metal layer leads to complicated process and relatively lower throughput and higher cost.

SUMMARY OF THE INVENTION

It is one object of the invention to provide a monolithic integrated inductor with simple process, low cost and high Q factor.

According to the claimed invention, an integrated inductor has a winding is provided. The winding includes a first level metal layer inlaid in a first dielectric layer, a second level metal layer inlaid in a second dielectric layer above the first dielectric layer, and a first line-shaped via structure inlaid in a slot of a third dielectric layer interposed between the first and second dielectric layers for interconnecting the first and second level metal layers. The winding further comprises an aluminum layer interconnected to the underlying second level metal layer through a second line-shaped via structure. The second line-shaped via structure is inlaid in an insulating layer above the second dielectric layer and is integral with the aluminum layer that is patterned above the insulating layer.

In one aspect of this invention, according to another embodiment, an integrated inductor includes a winding consisting of an aluminum layer atop a passivation layer, wherein the aluminum layer does not extend into the passivation layer and has a thickness that is not less than about 2.0 micrometers. The passivation layer has a thickness not less than about 0.8 micrometers. By eliminating copper from the integrated inductor structure and increasing the thickness of the passivation layer, the distance between the bottom surface of the inductor structure and the main surface of the semiconductor substrate is increased, thus the parasitic substrate coupling may be reduced and the Q-factor may be improved. Besides, the increased thickness of the aluminum layer may help improve the Q-factor as well.

According to the embodiment, the distance D between the bottom surface of the inductor structure and the main surface of the semiconductor substrate may be greater than 3.0 micrometers for high Q-factor performance in an advanced integrated circuit chip.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The invention pertains to an improved integrated inductor or transformer structure capable of improving the quality factor Q and reducing undesired substrate coupling. The manufacture cost can also be reduced. From one aspect, the invention uses line-shaped via structure, instead of hole-shaped via plug, for electrically connecting an upper level metal with a lower level metal. Conventionally, there are many via plugs deposed between conductive layers in a semiconductor device for electrically connection the conductive layers. In order to keep process uniformity, the conventional hole-shaped via plugs have a uniform shape and size. Therefore, for the sake of reduce resistance, an array of via plugs is utilized.

From another aspect of the invention, a layer of metal, such as aluminum, over the passivation layer of the integrated circuit chip is employed to fabricate the integrated inductor such that the topmost copper metal layer of the integrated circuit chip has a reduced thickness.

The layer of aluminum disposed over the passivation layer is typically used to provide a bondable interface atop a copper bond pad formed in the topmost copper metal layer of the integrated circuit chip in order to prevent oxidation of the underlying copper material.

The preferred embodiments of this invention will now be explained with the accompanying figures. Throughout the specification and drawings, the symbol "Mn" refers to the topmost level of the metal layers, such as copper layers, fabricated in the integrated circuit chip, while "Mn−1" refers to the copper metal layer that is just one level lower than the topmost copper metal layer and so on, wherein, preferably, n ranges between 4 and 8 (n=4-8), but not limited thereto. The symbol "V" refers to the via plug between two adjacent copper metal layers. For example, V5 refers to the via plug interconnecting M5 to M6.

Figure 1:
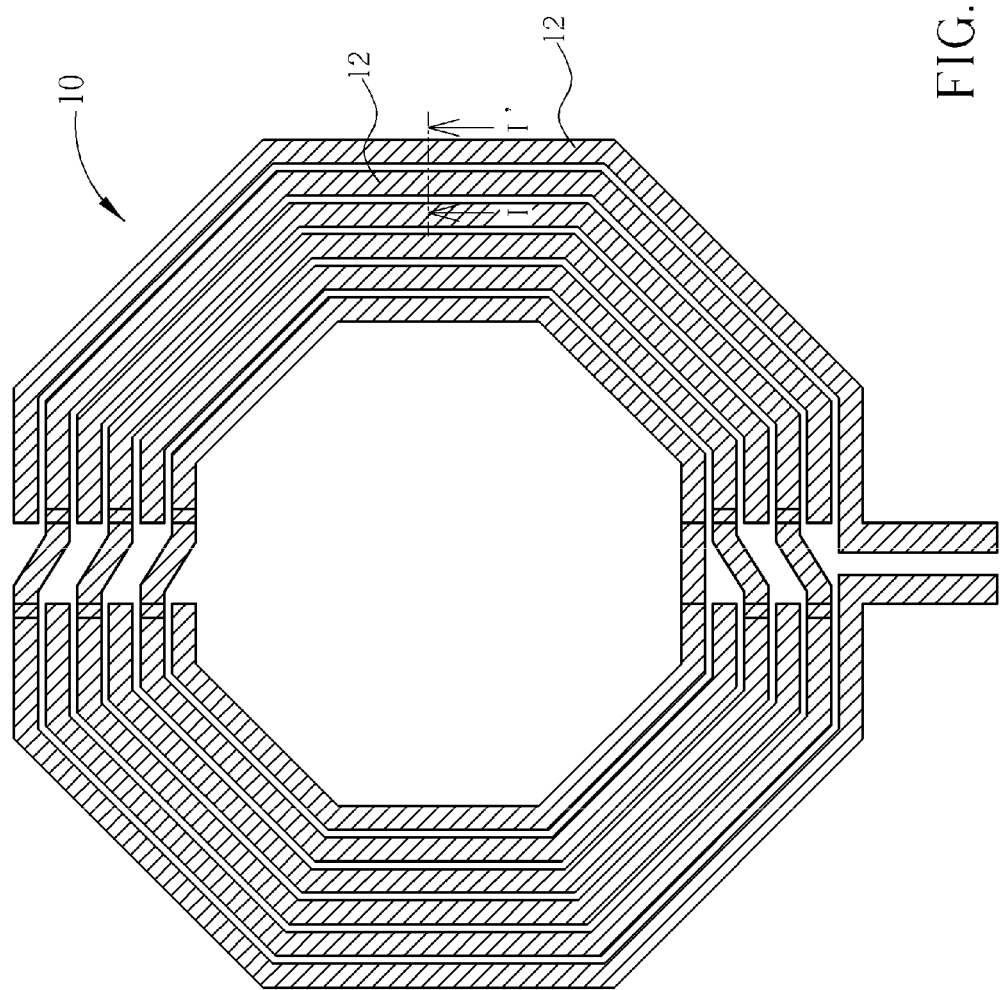
FIG. 1 illustrates a top view of an exemplary inductor according to this invention.
Figure 2:
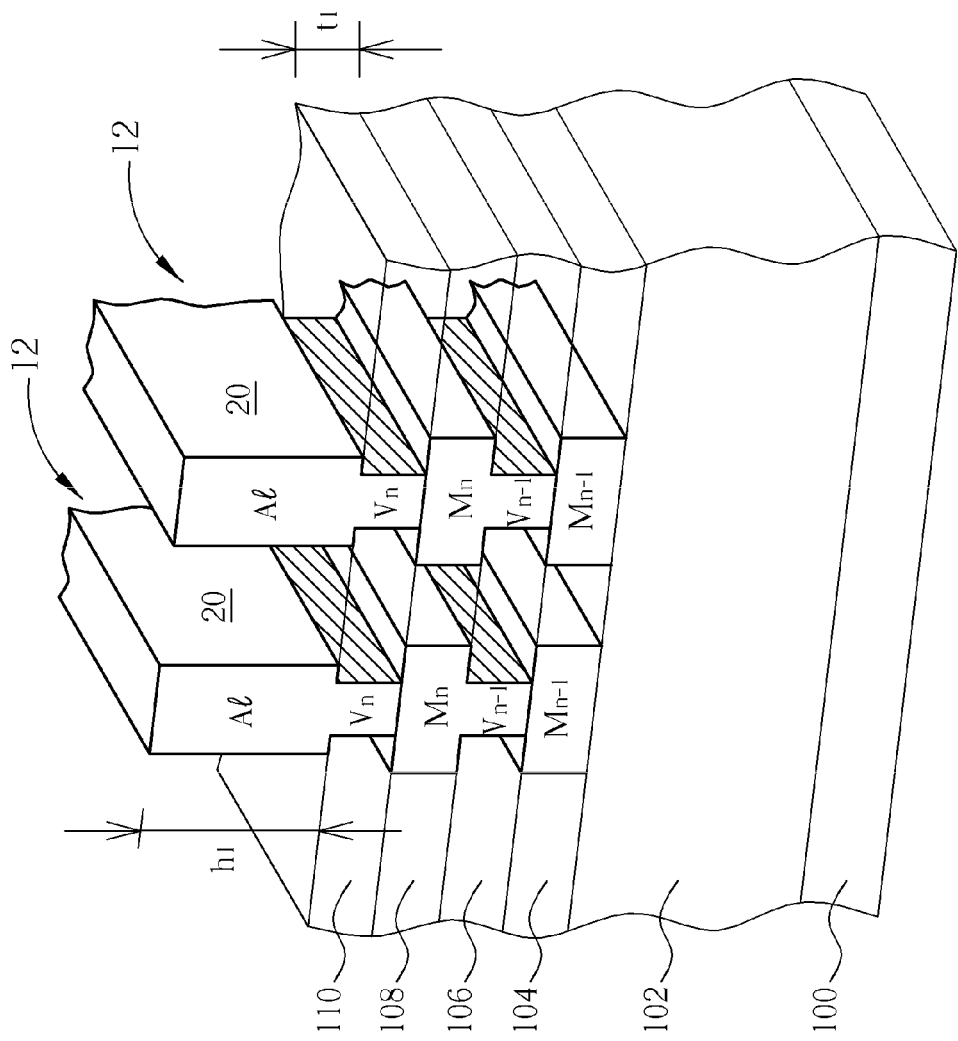
FIG. 2 is a sectional perspective view taken along line I-I' of FIG. 1 according to one embodiment of this invention.

FIG. 1 illustrates a top view of an exemplary differential inductor 10 with multi-turn windings according to this invention. FIG. 2 is a sectional perspective view taken along line I-I' of FIG. 1 in accordance with one preferred embodiment of this invention. For the sake of simplicity, only two neighboring windings 12 of the differential pair are shown in FIG. 2.

It is understood that although the integrated inductor 10 of the embodiment is demonstrated in the form of octagon shape. The integrated inductor can also be formed of any other suitable shapes, for example, spiral shape, and the shape or pattern in which the inductor is realized is not meant to be any limit. The invention is also applicable to single-ended type inductors.

As shown in FIG. 1 and FIG. 2, each winding 12 of the integrated inductor 10 having a vertical metal stack includes, in the order of, metal layer $M_{n-1}$, via plug layer $V_{n-1}$, metal layer $M_n$, via plug layer $V_n$ and an aluminum layer 20. The via plug layer $V_{n-1}$ electrically connects the metal layer $M_{n-1}$ to the overlying metal layer $M_n$, while the via plug layer $V_n$ electrically connects the metal layer $M_n$ to the overlying aluminum layer 20. According to the preferred embodiment, the winding 12 of the integrated inductor 10 does not include lower metal levels $M_1$~$M_{n-2}$ in order to reduce parasitic coupling to the substrate 100. According to another preferred embodiment, the lower metal levels $M_1$~$M_2$ are not included.

One germane feature of this invention is that the via plug layer $V_{n-1}$ and the via plug layer $V_n$ are both line-shaped. Preferably, the line-shaped via plug layer $V_{n-1}$ and the line-shaped via plug layer $V_n$ substantially have identical patterns with the metal layer $M_{n-1}$, metal layer $M_n$, and the aluminum layer 20, and have a line width that is slightly smaller than the line width of the metal layer $M_{n-1}$ or metal layer $M_n$. By employing the line-shaped via plug layer $V_{n-1}$ and the line-shaped via plug layer $V_n$, the resistance value of the integrated inductor is reduced.

In this embodiment, the smaller line width of the line-shaped via plug is not intended to be a limitation of the invention. In another embodiment, the line width of the line-shaped via plug may be equal to or greater than the line width of the metal layer. Further, the shape of the line-shaped via plug of above mentioned substantially identical patterns is not intended to be a limitation of the invention. In another embodiment, the pattern of the line-shaped via plug may include several segmented line-shaped patterns per winding.

According to the preferred embodiment, the metal layer $M_{n-1}$, via plug layer $V_{n-1}$ and metal layer $M_n$ are formed by conventional copper damascene methods such as single damascene methods or dual damascene methods. For example, the metal layer $M_{n-1}$ is formed by single damascene methods, while the metal layer $M_n$ and the integral via plug layer $V_{n-1}$ are formed by dual damascene methods. Therefore, the metal layer $M_n$ and the via plug layer $V_{n-1}$ are unitary.

As known in the art, the copper damascene methods provide a solution to form a conductive wire coupled with an integral via plug without the need of dry etching copper. Either a single damascene or a dual damascene structure may be used to connect devices and/or wires of an integrated circuit.

Generally, the dual damascene process can be sub-classified into trench-first, via-first, partial-via-first and self-aligned processes. By way of example, one conventional method of fabricating a dual damascene structure is to etch dielectric layers to form a trench and a via hole. The via hole and the trench are lined with barrier such as Ta or TaN and then filled with copper. A planarization process such as CMP is then performed to form the damascened metal interconnects.

A multi-layers of dielectric 102~110 are provided on the substrate 100. According to the preferred embodiment, the integrated inductor 10 is basically fabricated above the dielectric layer 102 that is interposed between the overlying dielectric layer 104 and the substrate 100. The metal layer $M_{n-1}$ is inlaid into the dielectric layer 104. The metal layer $M_n$ and the integral via plug layer $V_{n-1}$ are inlaid into the dielectric layers 108 and 106, respectively.

The dielectric layers 102~108 may comprise silicon oxide, silicon nitride, silicon carbide, silicon oxy-nitride, low-k or ultra low-k (ULK) materials such as organic (e.g., SiLK) or inorganic (e.g., HSQ).

According to the preferred embodiment, the via plug layer $V_n$ is comprised of aluminum and is integral with the aluminum layer 20. That is, the via plug layer $V_n$ and the aluminum layer 20 are unitary. Structurally, the via plug layer $V_n$ is inlaid into a corresponding via slot (not explicitly shown) formed in a passivation layer 110 and the aluminum layer 20 is patterned above the passivation layer 110. The via plug layer $V_n$ and the aluminum layer 20 can be formed concurrently with the conventional re-distribution layer (not shown). Preferably, the thickness h1 of the aluminum layer 20 may range between 1 micrometer and 1.5 micrometers, and is normally less than 1.5 micrometers.

The passivation layer 110 may be silicon oxide, silicon nitride, silicon carbide, silicon oxy-nitride, polyimide or the like. According to this embodiment, the passivation layer 110 has a thickness t1 of about 0.8~1.2 micrometers, but should be not limited thereto.

The integrated inductor 10 is fully compatible with standard logic processes and does not contain an ultra-thick copper layer due to that the integral via plug layer $V_n$ and the aluminum layer 20 are incorporated.

In another preferred embodiment, by employing the line-shaped via plug layer, the resistance value of the integrated inductor is reduced. The high Q integrated inductor can be achieved by a vertical metal stack including, in the order of, metal layer $M_{n-1}$, via plug layer $V_{n-1}$, and metal layer $M_n$. Also, the high Q integrated inductor can be achieved by a vertical metal stack including, in the order of, top copper layer $M_n$, via plug layer $V_n$ and aluminum layer.

As the semiconductor technology advances, the thickness of each of the dielectric layers in the integrated circuits becomes thinner and thinner. This results in reduced distance between the bottom surface of the inductor structure and the main surface of the semiconductor substrate and thus imposes undesired substrate coupling on the inductor, which degrades the Q-factor. To cope with the degradation of the Q-factor due to the inevitable shrinkage in the thickness of the inter-layer dielectric layers in an advanced integrated circuit, a novel integrated inductor structure is provided according to still another embodiment of this invention.

Figure 3:
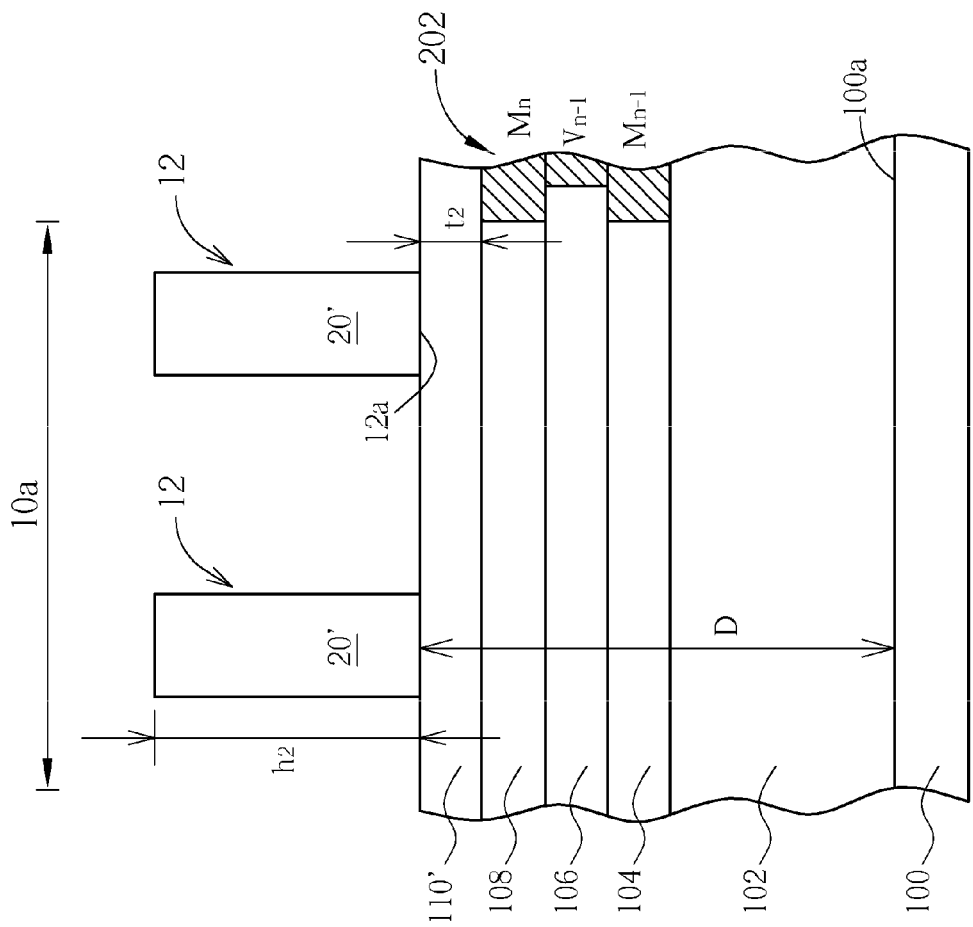
FIG. 3 is a schematic, cross-sectional diagram showing an integrated inductor structure with further improved Q-factor and reduced substrate coupling according to another embodiment of this invention.

FIG. 3 is a schematic, cross-sectional diagram showing an integrated inductor structure with further improved Q-factor and reduced parasitic substrate coupling according to another embodiment of this invention, wherein like numeral numbers designate like elements, layers or regions. As shown in FIG. 3, likewise, the integrated inductor structure, which is formed in an inductor region 10a, comprises multi-turn windings wherein, for the sake of simplicity, only two neighboring windings 12 of the differential pair are shown in FIG. 3. The integrated inductor of the embodiment may be in the form of octagon shape, spiral shape or any other suitable shapes when viewed from the top of the integrated inductor. An exemplary shape of the integrated inductor according to the embodiment is similar to that as shown in FIG. 1.

Outside the inductor region 10a, a copper interconnection structure 202 may be provided. The copper interconnection structure 202 may be fabricated in any of the metal levels $M_1 \sim M_n$ and any of the via plug layer $V_1 \sim V_{n-1}$, which are inlaid in the corresponding dielectric layers 102~108. In the inductor region, no copper interconnection is formed according to the embodiment. The copper interconnection structure may be fabricated by conventional copper damascene methods. The dielectric layers 102~108 may comprise silicon oxide, silicon nitride, silicon carbide, silicon oxy-nitride, low-k or ultra low-k (ULK) materials.

According to the embodiment, each of the two neighboring windings 12 of the integrated inductor structure is made of aluminum layer 20' without incorporating copper. That is, the integrated inductor structure may be defined only in the aluminum layer 20' with an increased thickness h2 that is thicker than h1. For example, the thickness h2 is greater than about 2.0 micrometers, such as 3.0 micrometers or even thicker. The thicker aluminum layer 20' may help reduce the inductor resistance.

In one embodiment, the aluminum layer 20' may be a redistribution layer. The redistribution layer may comprise input/output pads and wire traces as well. The integrated inductor may be formed in an integrated circuit device having a substrate and a plurality of metal layers, wherein at least one of the metal layers consists of copper. There may not be any of the metal layers formed between the integrated inductor and the substrate. At least one of top two of the metal layers may consist of copper. Preferably, a distance D between a bottom surface of the integrated inductor and a main surface 100a of the substrate 100 is not less than a distance between a bottom surface of a topmost one of the metal layers and the main surface 100a of the substrate.

The integrated inductor structure is formed atop the passivation layer 110' that has a thickness t2 not less than about 0.8 micrometers. According to the embodiment, the thickness t2 of the passivation layer 110' is greater than the thickness t1 of the passivation layer 110 of FIG. 2. The increased thickness of the passivation layer 110' is one feature of this invention.

According to the embodiment, the passivation layer 110' may be silicon oxide, silicon nitride, silicon carbide, silicon oxy-nitride, polyimide or the like.

By eliminating copper from the integrated inductor structure and increasing the thickness of the passivation layer 110', the distance D between the bottom surface 12a of the inductor structure and the main surface 100a of the semiconductor substrate 100 is increased, thereby reducing parasitic substrate coupling and improving the Q-factor. According to one embodiment, the distance D between the bottom surface of the inductor structure and the main surface 100a of the semiconductor substrate is preferably greater than about 3.0 micrometers for high Q-factor performance in an advanced integrated circuit chip. According to another embodiment, the distance D between the bottom surface of the integrated inductor and the main surface 100a of the substrate 100 may be not larger than about 10 micrometers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated inductor, comprises:
    an aluminum winding, having a thickness not less than about 2 micrometers;
    a passivation layer, disposed under the aluminum winding, wherein the aluminum winding does not extend into the passivation layer; and
    a plurality of copper metal layers, disposed under the passivation layer.

2. The integrated inductor according to claim 1, wherein the passivation layer has a thickness not less than about 0.8 micrometers.

3. The integrated inductor according to claim 1, wherein the aluminum layer is a redistribution layer.

4. The integrated inductor according to claim 1, wherein the integrated inductor is formed in an integrated circuit device having a substrate and a plurality of metal layers, at least one of the metal layers consists of copper.

5. The integrated inductor according to claim 4, wherein none of the metal layers is formed between the integrated inductor and the substrate.

6. The integrated inductor according to claim 4, wherein a distance between a bottom surface of the integrated inductor and a main surface of the substrate is not less than a distance between a bottom surface of a topmost one of the metal layers and the main surface of the substrate.

7. The integrated inductor according to claim 4, wherein a distance between a bottom surface of the integrated inductor and a main surface of the substrate is not less than about 3.0 micrometers.

8. The integrated inductor according to claim 4, wherein at least one of top two of the metal layers consists of copper.

* * * * *